United States Patent
Fossum et al.

(10) Patent No.: US 8,520,104 B2
(45) Date of Patent: *Aug. 27, 2013

(54) IMAGE SENSOR DEVICES HAVING DUAL-GATED CHARGE STORAGE REGIONS THEREIN

(75) Inventors: Eric R. Fossum, Wolfeboro, NH (US); Young Gu Jin, Hwasung-si (KR); Soo Jung Hwang, Gyeonggi-do (KR); Dae Kil Cha, Suncheon-si (KR); Yoon Dong Park, Yongin-si (KR); Jung Chak Ahn, Yongin-si (KR); Kyoung Sik Moon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 803 days.

This patent is subject to a terminal disclaimer.

(21) Appl. No.: 12/632,989

(22) Filed: Dec. 8, 2009

(65) Prior Publication Data

US 2010/0141821 A1 Jun. 10, 2010

(30) Foreign Application Priority Data

Dec. 8, 2008 (KR) ........................ 10-2008-0123762

(51) Int. Cl.
*H04N 3/14* (2006.01)
*H04N 5/335* (2011.01)
*H01L 27/148* (2006.01)
*G01C 3/08* (2006.01)

(52) U.S. Cl.
USPC ........................ 348/294; 257/222; 356/4.01

(58) Field of Classification Search
None
See application file for complete search history.

(56) References Cited

U.S. PATENT DOCUMENTS

| 5,502,318 | A | 3/1996 | Hynecek |
| 6,084,259 | A | 7/2000 | Kwon |
| 7,235,824 | B1 * | 6/2007 | Singh ............................ 257/217 |
| 7,236,197 | B2 | 6/2007 | Goto |
| 7,626,685 | B2 * | 12/2009 | Jin et al. ....................... 356/4.01 |
| 8,035,806 | B2 * | 10/2011 | Jin et al. ....................... 356/4.01 |
| 2002/0024067 | A1 * | 2/2002 | Han ............................... 257/222 |
| 2007/0267666 | A1 * | 11/2007 | Park et al. ..................... 257/292 |
| 2009/0026510 | A1 * | 1/2009 | Lim ............................... 257/292 |
| 2009/0278174 | A1 * | 11/2009 | Ichikawa et al. .............. 257/222 |

FOREIGN PATENT DOCUMENTS

| JP | 2000-082839 | 3/2000 |
| JP | 2003-152172 | 5/2003 |
| KR | 10-2000-0003413 A | 1/2000 |
| KR | 10-2003-0040109 A | 5/2003 |

* cited by examiner

*Primary Examiner* — Justin P Misleh
(74) *Attorney, Agent, or Firm* — Myers Bigel Sibley & Sajovec, P.A.

(57) ABSTRACT

An image sensor device may include a dual-gated charge storage region within a substrate. The dual-gated charge storage region includes first and second diodes within a common charge generating region. This charge generating region is configured to receive light incident on a surface of the image sensor device. The first and second diodes include respective first conductivity type regions responsive to first and second gate signals, respectively. These first and second gate signals are active during non-overlapping time intervals.

16 Claims, 10 Drawing Sheets

IMAGE SENSOR DEVICES HAVING DUAL-GATED CHARGE STORAGE REGIONS THEREIN

REFERENCE TO PRIORITY APPLICATION

This application claims priority to Korean Patent Application No. 10-2008-0123762, filed Dec. 8, 2008, the contents of which are hereby incorporated herein by reference.

FIELD OF THE INVENTION

The present invention relates to integrated circuit devices and, more particularly, to image sensor devices.

BACKGROUND

Conventionally, an efficiency in collecting photocharges is controlled by using a photogate of a MOS structure and the distance from an object can be measured by using the phase difference between emitted light and reflected light. However, in the MOS-type photogate structure using poly-silicon (poly-Si), a light absorption factor is generated in the course of the measurement and thus loss of light efficiency may be generated. When the thickness of poly-Si is made thin in order to restrict the loss, the resistance of poly-silicon increases so that the voltage applied to the photogate may not be sufficiently transferred.

Also, in the MOS type photogate structure, noise due to dark current may be generated because photocharges concentrate at the boundary surface between Si and $SiO_2$. Furthermore, the MOS type photogate structure can require a high voltage of 3.3V or higher for stable operation thereof.

SUMMARY

Image sensor devices according to embodiments of the invention include a dual-gated charge storage region within a substrate. The dual-gated charge storage region includes first and second diodes within a common charge generating region. This charge generating region is configured to receive light incident on a surface of the image sensor device. The first and second diodes include respective first conductivity type regions responsive to first and second gate signals, respectively. These first and second gate signals are active during non-overlapping time intervals. The first and second diodes also include respective second conductivity type regions that form non-rectifying semiconductor junctions with the common charge generating region. The image sensor devices further include a first transfer transistor having a first source/drain region electrically coupled to the common charge generating region and a second transfer transistor having a first source/drain region electrically coupled to the common charge generating region.

According to some of these embodiments of the invention, the first conductivity type regions of the first and second diodes are P-type anode regions and the second conductivity type regions are N-type cathode regions. In particular, the first source/drain region of the first transistor may be disposed in the N-type cathode region associated with the first diode.

According to additional embodiments of the invention, the image sensor device includes a substrate having a well region of first conductivity type therein, and the common charge generating region forms a P-N rectifying junction with the well region. The first transfer transistor includes an insulated gate electrode extending opposite respective portions of the well region, the common charge generating region and the N-type cathode region of the first diode.

Image sensor devices according to additional embodiments of the invention include a dual-gated charge storage region within a substrate. The dual-gated charge storage region includes first and second diodes within a common charge generating region, which is configured to receive light incident on a surface of the image sensor device. The first and second diodes have respective first conductivity type anode regions adjacent a light receiving surface of the substrate and second conductivity type cathode regions that form non-rectifying semiconductor junctions with the common charge generating region. According to further aspects of these embodiments, the image sensor device may be configured to drive the first conductivity type anode regions of the first and second diodes with first and second gate signals, respectively, which are active during first and second non-overlapping time intervals, respectively. The image sensor may also include a first transfer transistor having a source/drain region in the cathode region of the first diode, and a second transfer transistor having a source/drain region in the cathode region of the second diode. In some of these embodiments of the invention, the anode region of the first diode includes a first plurality of P-type fingers within the common charge generating region. The anode region of the second diode may also include a second plurality of P-type fingers that are interdigitated with the first plurality of P-type fingers.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

Figure 1:
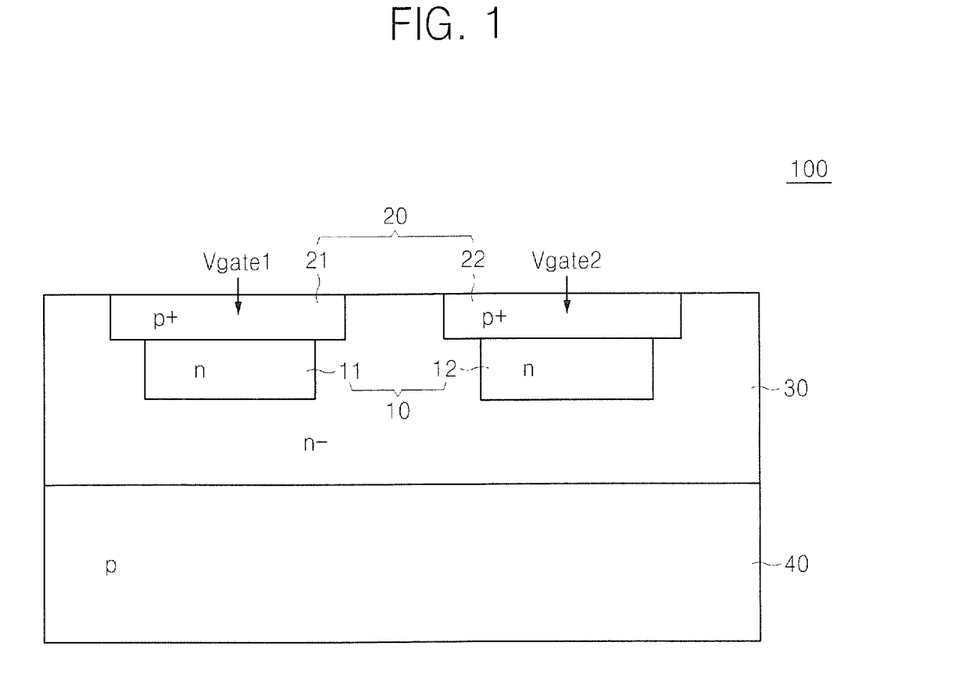
FIG. 1 is a cross sectional view of a pixel array of a 3D image sensor according to an exemplary embodiment of the present inventive concept.

FIG. 1 is a cross sectional view of a pixel array 100 of a 3D image sensor according to an exemplary embodiment of the present inventive concept. Referring to FIG. 1, the pixel array 100 may include one or more unit pixels. The pixel array 100 may include photocharge storage regions 11 and 12 (or, collectively a photocharge storage region 10), storing photocharges, gating regions 21 and 22 (or, collectively a gating region 20), controlling the photocharge storage region 10, and a photocharge generation region 30 providing photocharges to the photocharge storage region 10.

As shown in FIG. 1, the photocharge generation region 30 may be doped into a first type, for example, an n-type. Also, the photocharge generation region 30 may absorb externally incident light and generate photocharges in response to the absorbed light. In detail, the photocharge generation region 30 may absorb the incident light emitted by a light source (not shown) and reflected by a subject (not shown). Also, according to an exemplary embodiment, photocharges in an amount proportional to the intensity of the absorbed light may be generated in the photocharge generation region 30.

The photocharge storage region 10 may store the photocharges generated by the photocharge generation region 30. The photocharge storage region 10 may be doped into the first type, for example, the n-type. In detail, as illustrated in FIG. 1, the photocharge storage region 10 may be implemented in form of a buried well. Accordingly, the photocharges generated by the photocharge generation region 30 may be efficiently stored in the photocharge storage region 10.

The photocharge generation region 30 and the photocharge storage region 10 may be doped into the same type, for example, the n-type. According to an exemplary embodiment, the doping concentration of the photocharge storage region 10 may be higher than that of the photocharge generation region 30. Also, to gather the photocharges generated in a deep area, the photocharge generation region 30 may be doped at a low concentration or made in an intrinsic state.

The photocharges generated in the photocharge generation region 30 may be selectively transmitted to the photocharge storage region 10 in response to any one of voltages Vgate1 and Vgate2 applied to the gating region 20. The gating region 20 may be formed in one surface of the photocharge storage region 10. The gate voltages Vgate1 and Vgate2 may be respectively input to the gating region 20. As illustrated in FIG. 1, the gate region 20 may be doped into a second type, for example, a p-type.

Also, a first voltage, for example, Vgate1, applied to a first gating region (or first gate) 21, for example, and a second voltage, for example, Vgate2, applied to a second gating region (or, second gate) 22, for example, may have a phase difference of 180° from each other. According to an exemplary embodiment, the first and second voltages Vgate1 and Vgate2 may be square wave type voltages. Also, according to an exemplary embodiment, the amplitudes of the first and second voltages Vgate1 and Vgate2 may be not greater than 1V. Thus, since the square wave voltages having a phase difference of 180° are input to the first and second gates 21 and 22, the first and second gates 21 and 22 are not gated at the same time. Thus, the pixel array 100 according to the exemplary embodiment of the present inventive concept may be implemented such that the voltage may be selectively supplied to any one of the first and second gates 21 and 22.

For example, when the first voltage Vgate1 has a first level, for example, a low level, since the second voltage Vgate2 has a phase difference of 180° from the first voltage Vgate1, the second voltage Vgate2 may have a second level, for example, a high level. In this case, as the area of a second photocharge storage region 12, for example a second well 12 formed by contacting the second gate 22 extends and is deepened, the photocharges generated in the photocharge generation region 30 may be accumulated in the second well 12. Similarly, when the first voltage Vgate1 has a second level, for example, a high level, the second voltage Vgate2 may have the first level, for example, the low level. In this case, as the area of a first photocharge storage region 11, for example a first well 11 formed by contacting the first gate 21 extends and is deepened, the photocharges generated in the photocharge generation region 30 may be accumulated in the first well 11.

Also, the pixel array 100 according to the present exemplary embodiment may further include a substrate 40 that is formed under the photocharge generation region 30. The substrate 40 may be doped into the second type, for example, the p-type. Although in FIG. 1 the photocharge generation region 30 and the photocharge storage region 10 are doped into the n-type and the substrate 40 and the gating region 20 are doped into the p-type, the doping types of the elements may be reversely implemented according to an exemplary embodiment.

Figure 2:
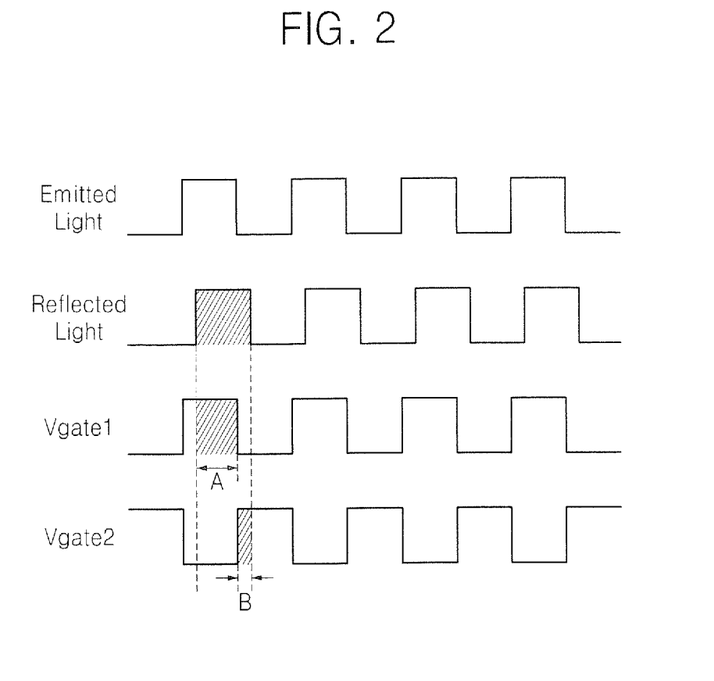
FIG. 2 is a timing diagram for explaining a principle to measure the distance from a subject by using the 3D image sensor according to an exemplary embodiment of the present inventive concept.

FIG. 2 is a timing diagram for explaining a principle to measure the distance from a subject by using a 3D image sensor according to an exemplary embodiment of the present inventive concept. Referring to FIGS. 1 and 2, the light emitted from a light source (not shown) may be reflected by a subject (not shown) and reflected light may be incident on a 3D image sensor according to an exemplary embodiment of the present inventive concept. As illustrated in FIG. 2, the light emitted from the light source may be a square wave.

When the reflected light reflected from the subject is absorbed in the photocharge generation region 30, photocharges may be generated in the photocharge generation region 30. The first voltage Vgate1 input to the first gate 21 may have the same phase as that of the light emitted from the light source. The second voltage Vgate2 input to the second gate 22 may have a phase difference of 180° from that of the first voltage Vgate1. Thus, while the reflected light is incident on the photocharge generation region 30, a time period "A" during which the first voltage Vgate1 applied to the first gate 21 has a second level, for example, a high level, and a time period "B" during which the second voltage Vgate2 applied to the second gate 22 has the second level, for example, the high level, may be determined.

The photocharges may be stored in the first and second wells 11 and 12 during the time periods "A" and "B". The distance from the subject may be calculated by using a difference in the amount of photocharges stored in the first and second wells 11 and 12.

Figure 3:
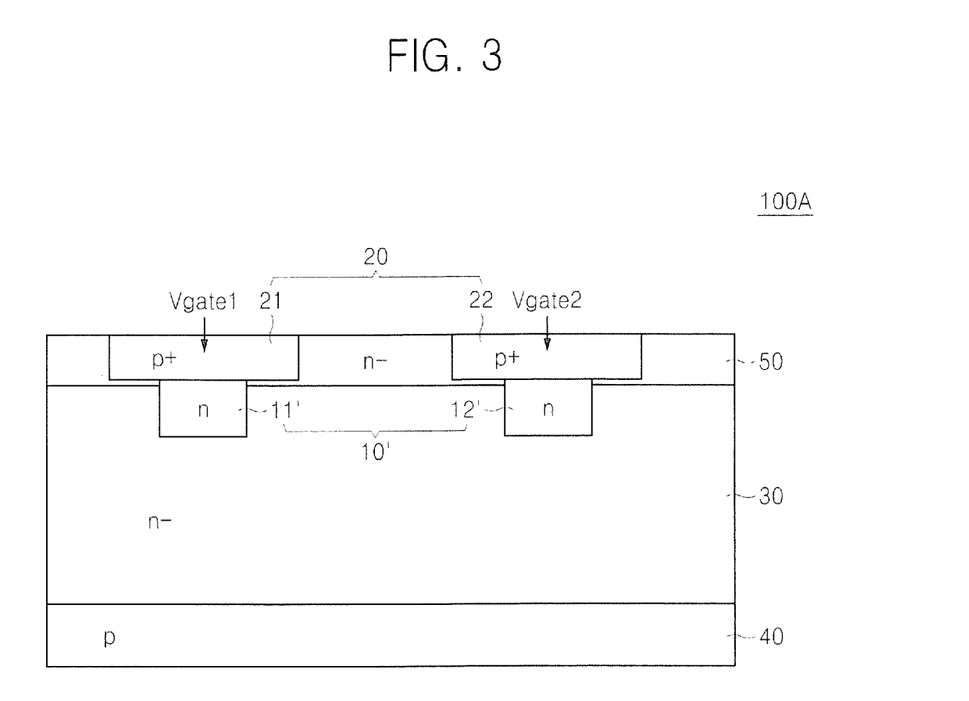
FIG. 3 is a cross sectional view of a pixel array of the 3D image sensor according to another exemplary embodiment of the present inventive concept.

FIG. 3 is a cross sectional view of a pixel array of a 3D image sensor according to another exemplary embodiment of the present inventive concept. Referring to FIGS. 1-3, the pixel array 100A according to the present exemplary embodiment may further include a leakage current restriction region 50 which restricts leakage current generated in the gating region 20.

Since the operations or structures of the substrate 40, the photocharge generation region 30, the photocharge storage region 10, and the gate region 20 are substantially the same as those of ones illustrated in FIG. 1, detailed descriptions thereof will be omitted herein. According to an exemplary embodiment, when the amplitude of a voltage applied to any one of the first and second gates 21 and 22 is increased, leakage current may be generated between the first and second gates 21 and 22. Accordingly, the leakage current restriction region 50 may be provided to restrict the generation of leakage current at its maximum.

In detail, as illustrated in FIG. 3, the leakage current restriction region 50 may be implemented by surrounding each of the first and second gates 21 and 22 or in a space between the first and second gates 21 and 22. Also, the leakage current restriction region 50 may be doped into the first type, for example, an n-type. The doping concentration of the leakage current restriction region 50 may be lower than that of the first well 11 and the second well 12 and higher than that of the photocharge generation region 30. Referring to FIGS. 1 and 3, the size of the photocharge storage region 10 of the FIG. 1 may be smaller than the size of the photocharge storage region 10' of the FIG. 3. Thus, as the distance between the first and second wells 11' and 12' increases further, a larger potential difference may be generated between the first and second wells 11' and 12'.

Figure 4:
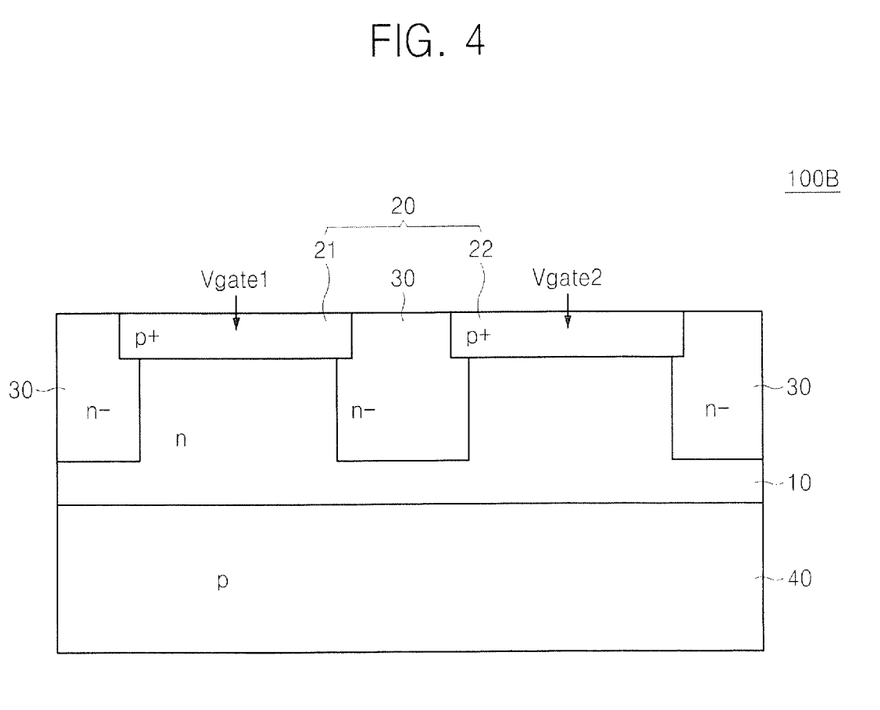
FIG. 4 is a cross sectional view of a pixel array of the 3D image sensor according to another exemplary embodiment of the present inventive concept.

FIG. 4 is a cross sectional view of a pixel array of a 3D image sensor according to another exemplary embodiment of the present inventive concept. Referring to FIGS. 1-4, the photocharge storage regions 10 are not separated from each other as in those illustrated in FIGS. 1 and 3, but are continuously connected to each other. As a voltage is applied to the first and second gates 21 and 22, the well under the first and second gates 21 and 22 may expand to a buried well. Thus, the pixel array 100B illustrated in FIG. 4 may obtain substantially the same effect as those of the pixel array 100 illustrated in FIGS. 1 and 3.

Figure 5:
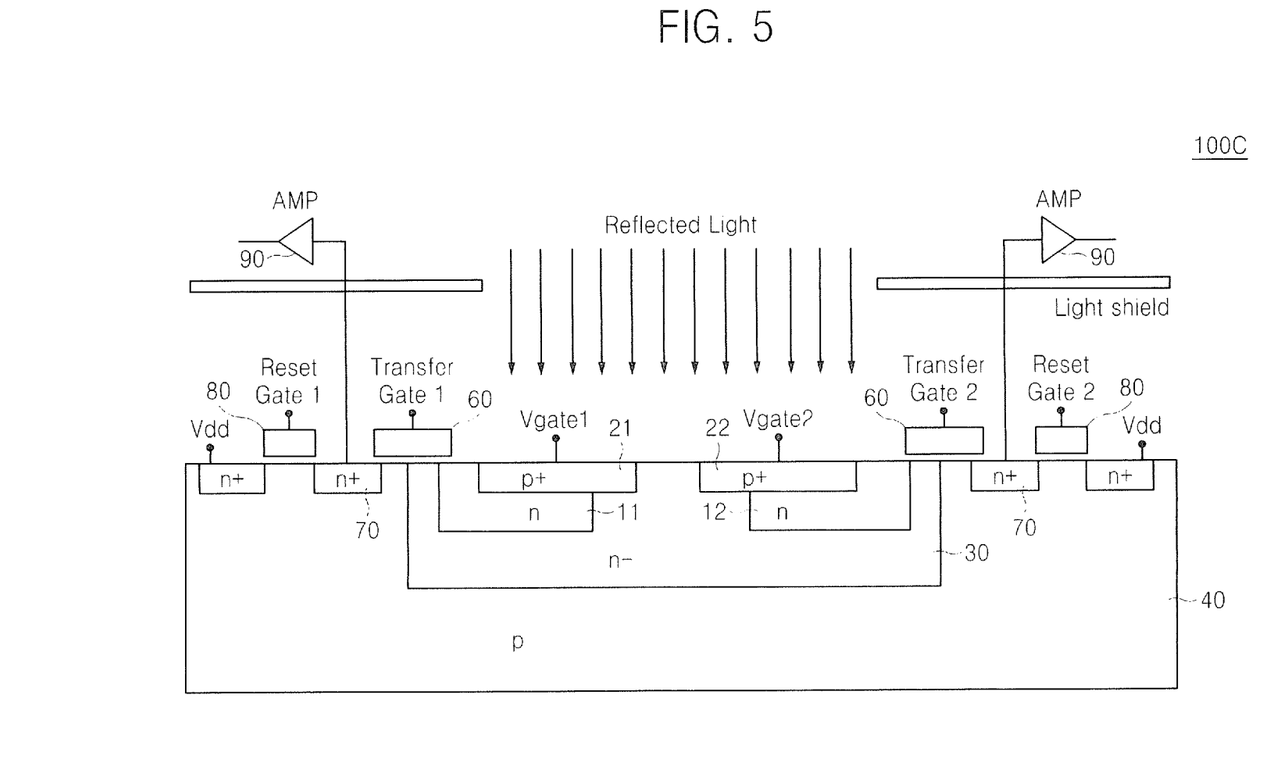
FIG. 5 is an extended cross sectional view of a pixel array of the 3D image sensor according to another exemplary embodiment of the present inventive concept.

FIG. 5 is an extended cross sectional view of a pixel array of a 3D image sensor according to another exemplary embodiment of the present inventive concept. Referring to FIGS. 1-5, the pixel array 100C separately includes a plurality of floating diffusion layers 70 corresponding to the first and second wells 11 and 12. The photocharges stored in each of the first and second wells 11 and 12 may be transferred to the floating diffusion layers 70 in response to the gating operation of a plurality of transfer gates 60.

For example, the photocharges stored in the first well 11 in response to a voltage applied to the first gate 21 may be transferred to the floating diffusion layers 70 in response to the gating operation of any one, for example, Transfer Gate 1, of the transfer gates 60. That is, an inversion channel is formed between the floating diffusion layers 70 and each of the first and second wells 11 and 12 by the gating operation of the transfer gates Transfer Gate 1 60. The photocharges stored in each of the first and second wells 11 and 12 may be transferred to the floating diffusion layers 70 along the inversion channel.

The photocharges accumulated in the floating diffusion layers 70 may be sensed by being amplified by a sensing amplifier AMP 90. After sensing is completed, the photocharges may be reset to the floating diffusion layers 70 by the gating operation of the reset gate 80. In this case, since one time of sampling may not provide a sufficient amplitude of a signal, the pixel array 100 according to the present exemplary embodiment may be implemented such as the sensing operation can be performed after the photocharge accumulation operation is performed several times. Accordingly, the voltages Vgate1 and Vgate2 applied to the first and second gates 21 and 22 may be controlled.

Figure 6A:
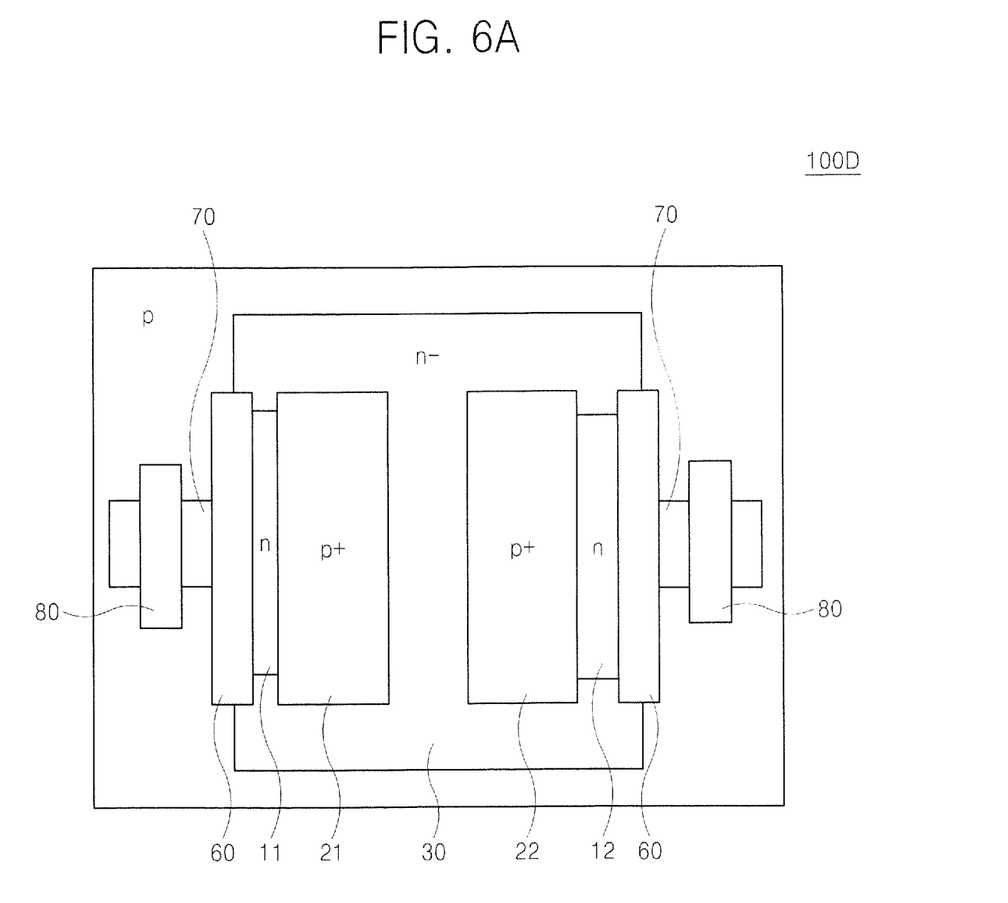
FIGS. 6A-6C are plan views of a pixel array according to an exemplary embodiment of the present inventive concept.
Figure 6B:
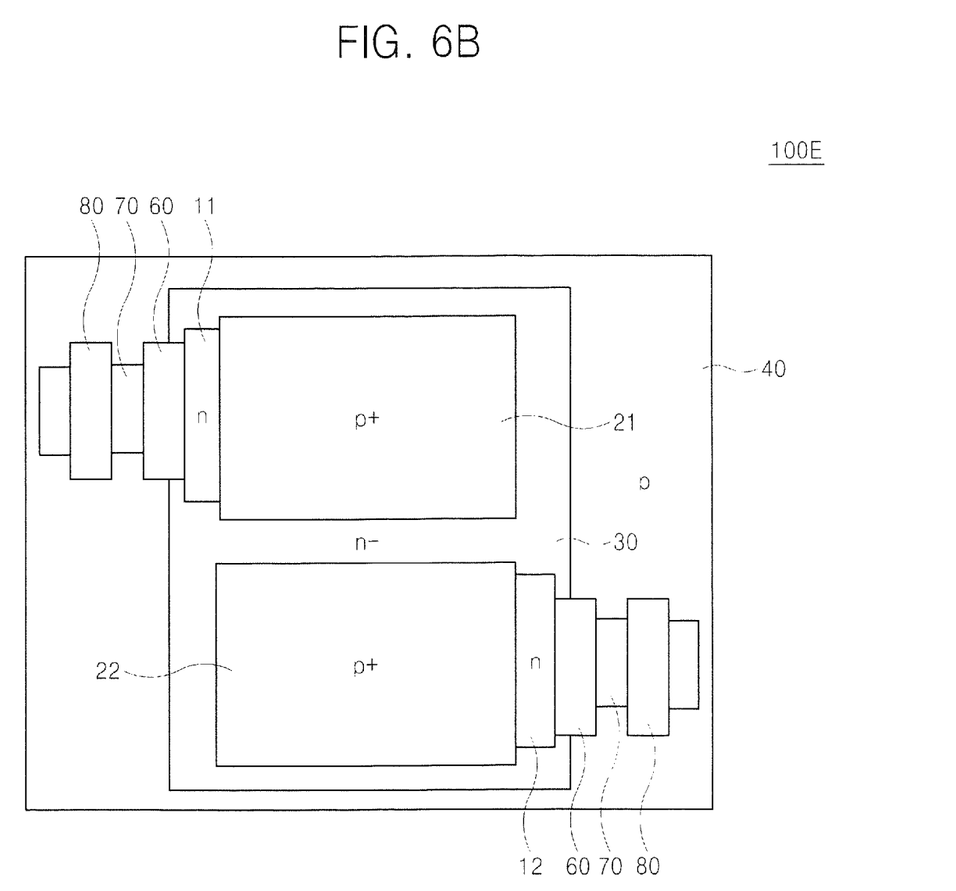
Figure 6C:
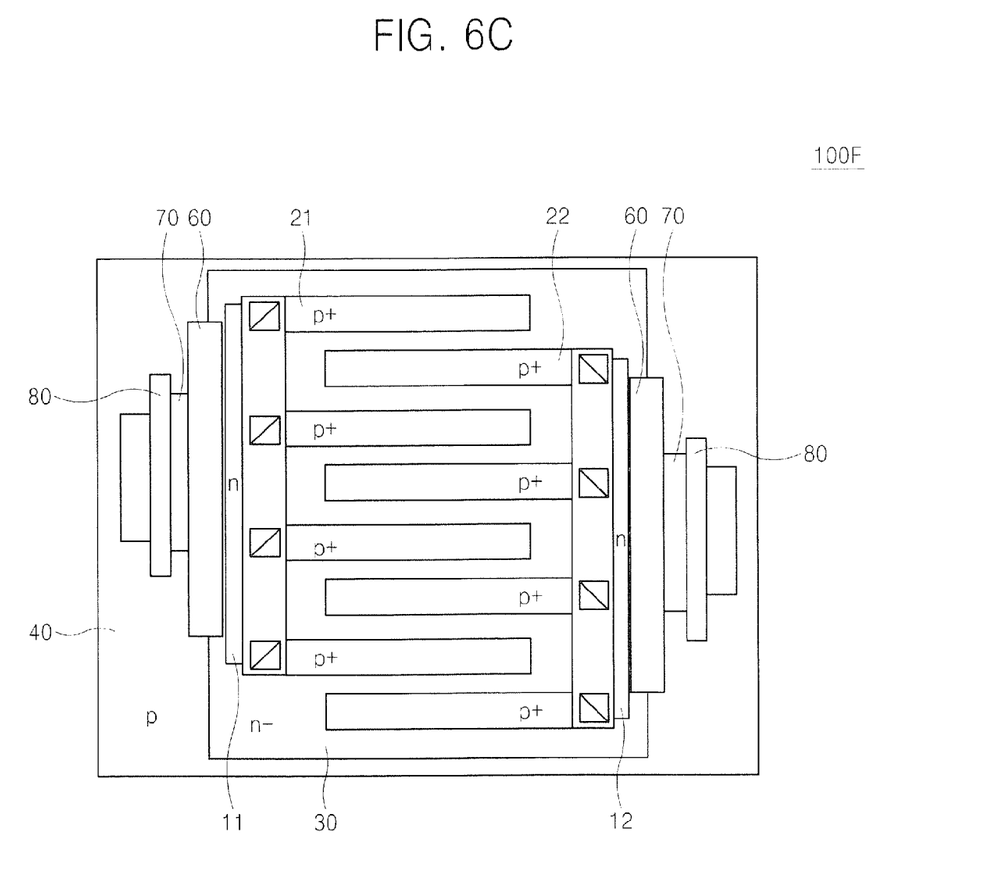

FIGS. 6A-6C are plan views of a pixel array according to an exemplary embodiment of the present inventive concept. FIG. 6A is a plan view of the pixel array 100C of FIG. 5, illustrating the structure to transfer the photocharges stored in each of the first and second wells 11 and 12 to the floating diffusion layers 70 in a lateral direction. Also, FIG. 6B illustrates another structure of the pixel array 100E of the present exemplary embodiment, in which the photocharges stored in each of the first and second wells 11 and 12 may be transferred in a vertical direction, that is, in a direction to penetrate in or out a drawing sheet. For this purpose, any one of the first and second gates 21 and 22 may be disposed at the front surface of the drawing sheet while the other one may be disposed at the rear surface thereof.

FIG. 6C illustrates the structure of the pixel array 100F according to another exemplary embodiment of the present inventive concept, which is suitable for implementing a pixel of a large area. For example, as illustrated in FIG. 6C, each of the first and second gates 21 and 22 includes a plurality of sub-gates and each sub-gate may be alternately arranged. Thus, each of the first and second gates 21 and 22 may efficiently store the photocharges formed by the light incident on a large area. Also, a pixel array having a large area may be implemented by using a gate in a zigzag format as illustrated in FIG. 6C.

Figure 7:
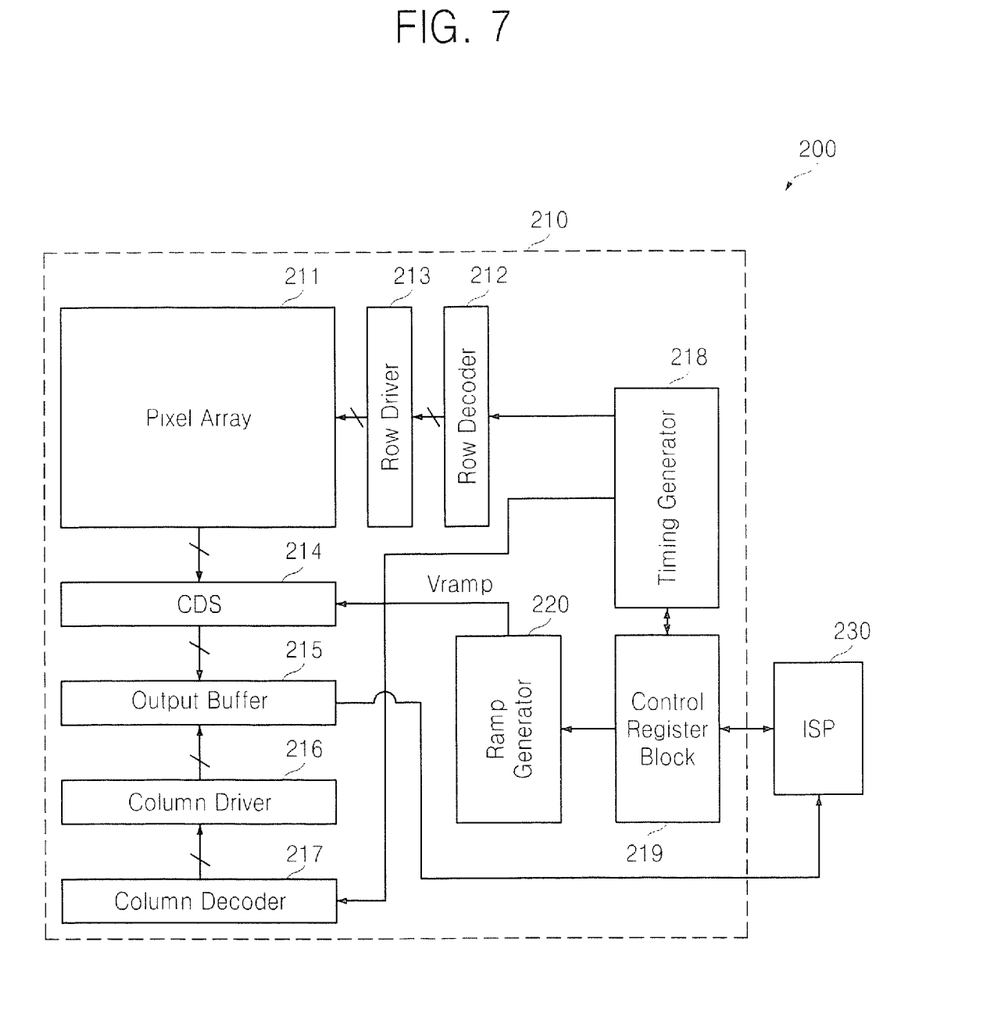
FIG. 7 is a block diagram of a 3D image sensor according to an exemplary embodiment of the present inventive concept.

FIG. 7 is a block diagram of a 3D image sensor 200 according to an exemplary embodiment of the present inventive concept. Referring to FIGS. 1-7, the 3D image sensor 200 may include a photoelectric conversion unit 210 and an image processor (ISP) 230. Each of the photoelectric conversion unit 210 and the image processor 230 may be implemented by a separate chip or module unit.

The photoelectric conversion unit 210 may generate an image signal of a subject based on the incident light. The photoelectric conversion unit 210 may include a pixel array 211, a row decoder 212, a row driver 213, a correlated double sampling (CDS) block 214, an output buffer 215, a column driver 216, a column decoder 217, a timing generator 218, a control register block 219, and a ramp signal generator 220.

The pixel array 211 may include any one of the pixel arrays of FIGS. 1, 3, 4, and 5 and a plurality of pixels, in each of which a plurality of row lines (not shown) and a plurality of column lines (not shown) are connected in a matrix format. The row decoder 212 may decode a row control signal, for example, an address signal, generated by the timing generator 218. The row driver 213 may select at least any one of the row lines included in the pixel array 211, in response to the decoded row control signal.

The CDS block 214 may perform correlated double sampling with respect to a pixel signal output from a unit pixel connected to any one of the column lines constituting the pixel array 211 to generate a sampling signal (not shown), compare a sampling signal with a ramp signal Vramp, and a digital signal according to a comparison result. The output buffer 215 may buffer and output signals output from the CDS block 214 in response to a column control signal, for example, an address signal, output from the column driver 216.

The column driver 216 may selectively activate at least any one of the column lines of the pixel array 211 in response to a decoded control signal, for example, an address signal, output from the column decoder 217. The column decoder 217 may decode a column control signal, for example, an address signal, generated by the timing generator 218. The timing generator 218 may generate a control signal to control the operation of at least one of the pixel array 211, the row decoder 212, the output buffer 215, the column decoder 217, and the ramp signal generator 220, based on a command output from the control register block 219.

The control register block 219 may generate various commands to control elements constituting the photoelectric conversion unit 210. The ramp signal generator 220 may output a ramp signal Vramp to the CDS block 214 in response to a command output from the control register block 219. The image processor 230 may generate an image of the subject based on pixel signals output from the photoelectric conversion unit 210.

Figure 8:
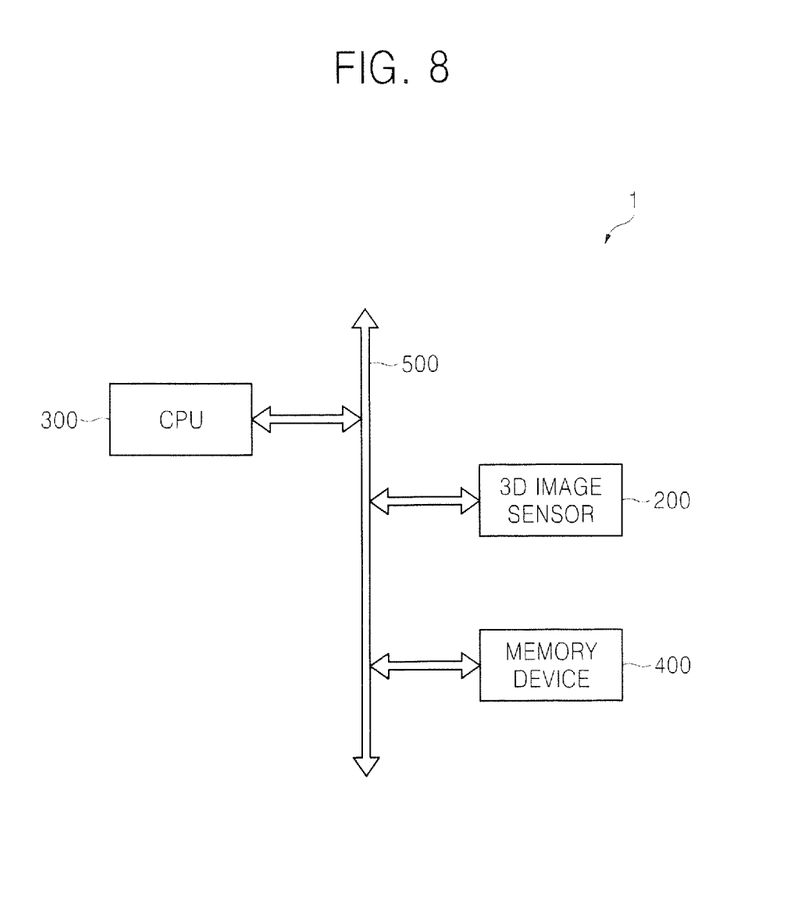
FIG. 8 is a block diagram of a semiconductor system having a 3D image sensor according to an exemplary embodiment of the present inventive concept.

FIG. 8 is a block diagram of a semiconductor system 1 having the 3D image sensor 200 according to an exemplary embodiment of the present inventive concept. For example, the semiconductor system 1 may be a computer system, a camera system, a scanner, a navigation system, a videophone, a supervision system, an automatic focus system, a tracing system, an operation monitoring system, and an image stabilization system, but the present inventive concept may not be limited thereto.

Referring to FIG. 8, a computer system that is a sort of the semiconductor system 1 may include a bus 500, a central processing unit (CPU) 300, a 3D image sensor 200, and a memory device 400. Also, the semiconductor system 1 may further include an interface (not shown) that is connected to the bus 500 and capable of communicating with an external device. The interface may be, for example, an I/O interface, and may be a wireless interface.

The CPU 300 may generate a control signal to control the operation of the 3D image sensor 200 and provide the control signal to the 3D image sensor 200 via the bus 500. The memory device 400 may receive and store an image signal output from the 3D image sensor 200 via the bus 500.

The 3D image sensor 200 may be integrated with the CPU 300 and the memory device 400. In some cases, a digital signal processor (DSP) is integrated with the CPU 300 and the memory device 400 or the 3D image sensor 200 only may be integrated in a separate chip.

As described above, since the 3D image sensor according to the present inventive concept includes a pixel having a junction gate structure, a light use efficiency may be increased. Also, according to the 3D image sensor according to the present inventive concept, since the generated photocharges are stored in the well by avoiding the boundary surface of Si or $SiO_2$, noise due to dark current may be greatly decreased. Furthermore, the 3D image sensor according to the present inventive concept may be easily implemented because an operation at a low operation voltage is possible.

While the inventive concept has been particularly shown and described with reference to exemplary embodiments thereof, it will be understood that various changes in form and details may be made therein without departing from the spirit and scope of the following claims.

What is claimed is:

1. A three-dimensional (3D) image sensor, comprising:
a light source emitting light; and
a pixel array;
wherein the pixel array comprises:
a first well and a second well, separated from each other, each being doped into a first type;
a first gate and a second gate respectively formed on a surface of the first well and a surface of the second well, each being doped into a second type; and
a first layer, doped into the first type, generating photocharges by absorbing reflected light incident on a surface of the 3D image sensor and providing the generated photocharge to the first or second well based on a voltage applied to the first or second gate;
wherein a first voltage is applied to the first gate and a second voltage having a phase difference of 180° from the first voltage is applied to the second gate and the first voltage input to the first gate has the same phase as that of the light emitted from the light source; and
wherein the first and second gates are configured to transfer the first and second charges, respectively, and wherein a calculation of distance between the 3D image sensor and an object illuminated by the light source is based on a difference between the first and second charges.

2. The 3D image sensor of claim 1, wherein the first or second voltage is a square wave voltage.

3. The 3D image sensor of claim 1, wherein the doping concentration of each of the first and second wells is higher than that of the first layer.

4. The 3D image sensor of claim 3, further comprising a second layer which restricts leakage current generated between the first and second gates, and the second layer is doped into a first type.

5. The 3D image sensor of claim 4, wherein the doping concentration of the second layer is lower than that of each of the first and second wells and higher than that of the first layer.

6. The 3D image sensor of claim 1, further comprising:
a transfer gate transferring the photocharges stored in any one of the first and second wells;
a floating diffusion layer receiving and storing the photocharges transferred by the transfer gate; and
a reset gate resetting the floating diffusion layer.

7. The 3D image sensor of claim 6, further comprising a sensing amplifier which amplifies the photocharges stored in the floating diffusion layer.

8. The 3D image sensor of claim 7, wherein the sensing amplifier amplifies the photocharges stored in the floating diffusion layer during a preset time period.

9. The 3D image sensor of claim 1, wherein each of the first and second gates comprises a plurality of sub-gates having a rod shape and sub-gates of the first gate and sub-gates of the second gate are sequentially arranged.

10. A semiconductor system comprising:
a three-dimensional (3D) image sensor including a light source and a plurality of pixel arrays;
a central processing unit (CPU) controlling the operation of the 3D image sensor; and
a memory device storing an image provided by the 3D image sensor controlled by the CPU,
wherein each of the plurality of pixel arrays comprises:
a first well and a second well, separated from each other, each being doped into a first type;
a first gate and a second gate respectively formed on surfaces of the first and second wells, each being doped into a second type; and
a first layer, doped into the first type, generating photocharges by absorbing reflected light incident on a surface of the 3D image sensor and providing the generated photocharge to the first or second well based on a voltage applied to the first or second gate;
wherein a first voltage is applied to the first gate and a second voltage having a phase difference of 180° from the first voltage is applied to the second gate, and the first voltage input to the first gate has the same phase as that of the light emitted from the light source; and
wherein the first and second gates are configured to transfer the first and second charges, respectively, and wherein a calculation of distance between the 3D image sensor and an object illuminated by the light source is based on a difference between the first and second charges.

11. A three-dimensional (3D) image sensor, comprising:
a photoelectric conversion device, comprising:
a dual-gated charge storage region within a substrate, said dual-gated charge storage region comprising first and second diodes within a common charge generating region configured to receive light incident on a surface of the 3D image sensor, said first and second diodes comprising respective first conductivity type regions responsive to first and second gate signals, respectively, which are active during non-overlapping time intervals, and respective second conductivity type regions that form non-rectifying semiconductor junctions with the common charge generating region;

a first transfer transistor having a first source/drain region electrically coupled to the common charge generating region; and a second transfer transistor having a first source/drain region electrically coupled to the common charge generating region;

wherein said first diode and said first transistor are configured to support transfer of first charges accumulated within the second conductivity type region of said first diode to a first floating diffusion region located external to the common charge generating region when the first gate signal is active; and wherein said second diode and said second transistor are configured to support transfer of second charges accumulated within the second conductivity type region of said second diode to a second floating diffusion region located external to the common charge generating region when the second gate signal is active; and an image processor electrically coupled to said photoelectric conversion device, said image processor configured to calculate a distance between a subject illuminated by the light and the 3D image sensor by determining a difference between the transferred first charges and the transferred second charges.

12. The 3D image sensor of claim 11, wherein said image processor is configured to calculate a distance between a subject illuminated by the light and the 3D image sensor by determining a difference between the transferred first charges and the transferred second charges during immediately consecutive active portions of the first and second gate signals.

13. The 3D image sensor of claim 11, wherein the first conductivity type regions of the first and second diodes are P-type anode regions; and wherein the second conductivity type regions of the first and second diodes are N-type cathode regions.

14. The 3D image sensor of claim 13, wherein the first source/drain region of said first transistor is in the N-type cathode region associated with the first diode.

15. The 3D image sensor of claim 13, wherein the substrate comprises a well region of first conductivity type therein; wherein the common charge generating region extends within the well region; and wherein said first transfer transistor comprises an insulated gate electrode extending opposite respective portions of the well region, the common charge generating region and the N-type cathode region of the first diode.

16. The 3D image sensor of claim 13, wherein the anode region of the first diode comprises a first plurality of P-type regions within the common charge generating region; and wherein the anode region of the second diode comprises a second plurality of P-type regions.

* * * * *